United States Patent [19]

Bruchez

[11] Patent Number: 4,700,456

[45] Date of Patent: Oct. 20, 1987

[54] SEMICONDUCTOR DEVICE CONTAINING BIPOLAR TRANSISTOR FORMED BY METHOD INCLUDING THREE PHOTOLITHOGRAPHIC STEPS

[75] Inventor: Jeffrey A. Bruchez, Stockport, England

[73] Assignee: Ferranti, plc, Cheadle, England

[21] Appl. No.: 790,607

[22] Filed: Oct. 23, 1985

[30] Foreign Application Priority Data

Oct. 24, 1984 [GB] United Kingdom ................ 8426897

[51] Int. Cl.$^4$ .................. H01L 29/72; H01L 21/473; H01L 21/74
[52] U.S. Cl. ............................. 439/54; 148/DIG. 10; 148/DIG. 11; 357/34; 437/31; 437/229
[58] Field of Search ............ 29/576 E, 576 W, 576 C, 29/578, 571; 148/DIG. 10, DIG. 11, DIG. 102, DIG. 103; 357/34, 35

[56] References Cited

U.S. PATENT DOCUMENTS

| | | | |
|---|---|---|---|
| 3,948,694 | 4/1976 | Mills, III | 148/187 |
| 4,372,030 | 2/1983 | Saitoh | 29/569 R |
| 4,498,227 | 2/1985 | Howell et al. | 29/576 B |
| 4,551,911 | 11/1985 | Sasaki et al. | 29/576 W |
| 4,577,397 | 3/1986 | Komatsu et al. | 29/576 B |
| 4,616,405 | 10/1986 | Yasuoka | 29/578 |

FOREIGN PATENT DOCUMENTS 2156583 10/1985 United Kingdom .

Primary Examiner—Olik Chaudhuri
Attorney, Agent, or Firm—Dennis P. Clarke

[57] ABSTRACT

For a semiconductor device including a bipolar transistor, the emitter, a heavily doped base region surrounding the emitter, and base and collector contact regions, (the collector including a buried layer at an epitaxial layer/substrate interface of the semiconductor body), are formed by employing, on the epitaxial layer, layers of first and second resists, each resist layer comprising an impurity barrier, the second resist being attacked by an etchant relatively inactive with the first resist, by first or second photolithographic steps, of a sequence of only three photolithographic steps, forming three apertures in a first resist layer, to expose the subsequent emitter and two contact regions, then before each, or the remaining photolithographic step of the sequence, providing a second resist layer, and exposing selectively, and coarsely through the second resist, the subsequent emitter, and either the collector contact region by the third photolithographic step, or the base contact region by the second photolithographic step.

5 Claims, 19 Drawing Figures

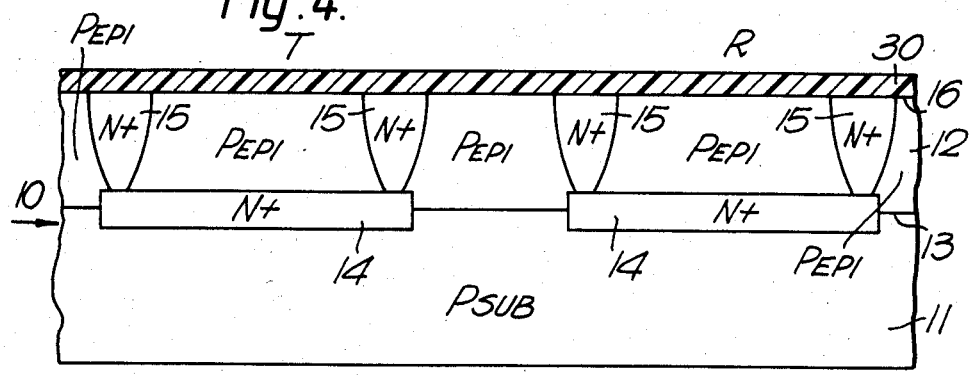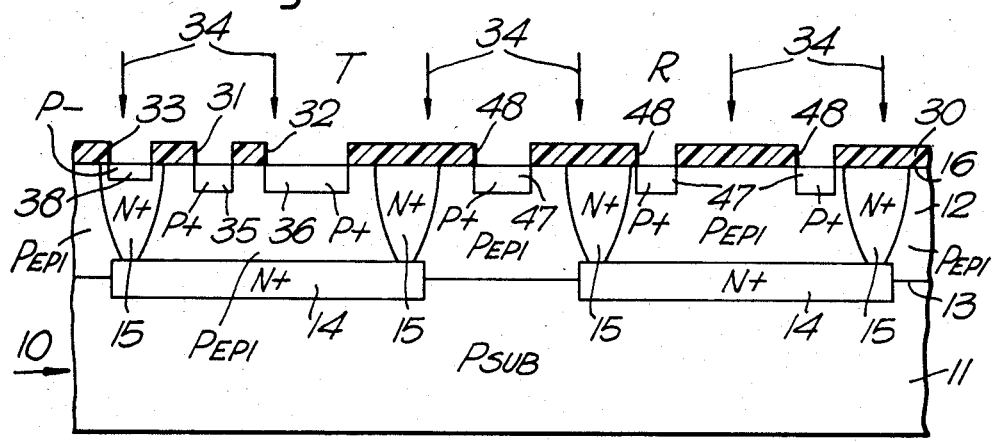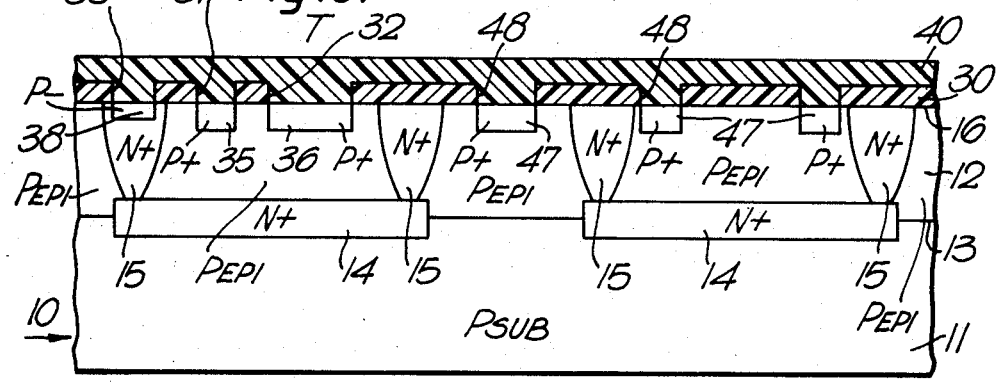

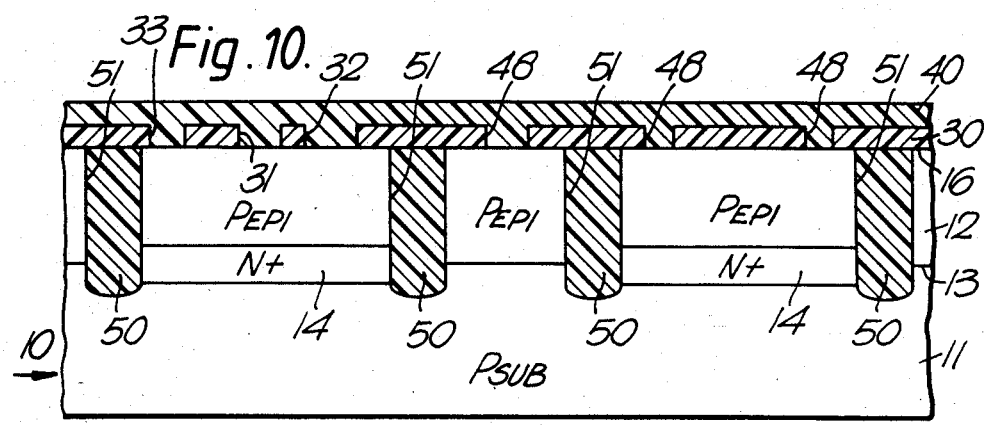
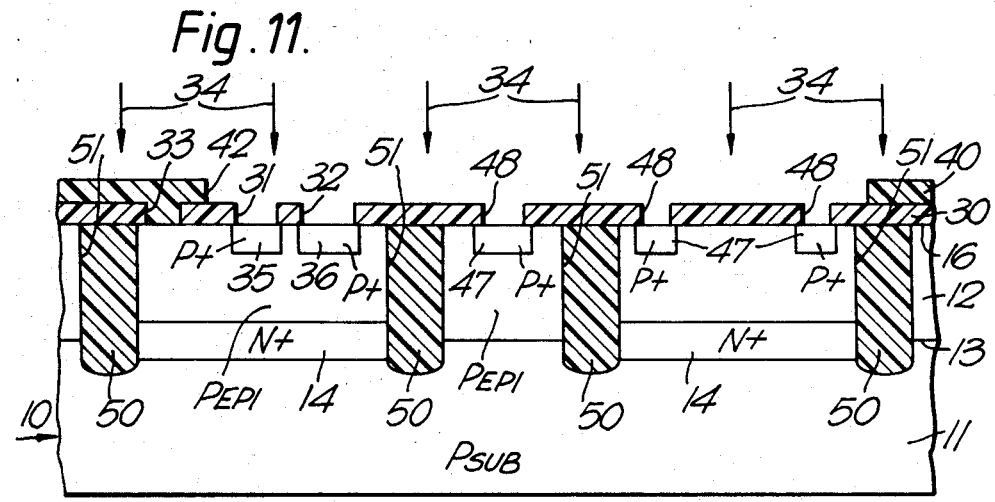
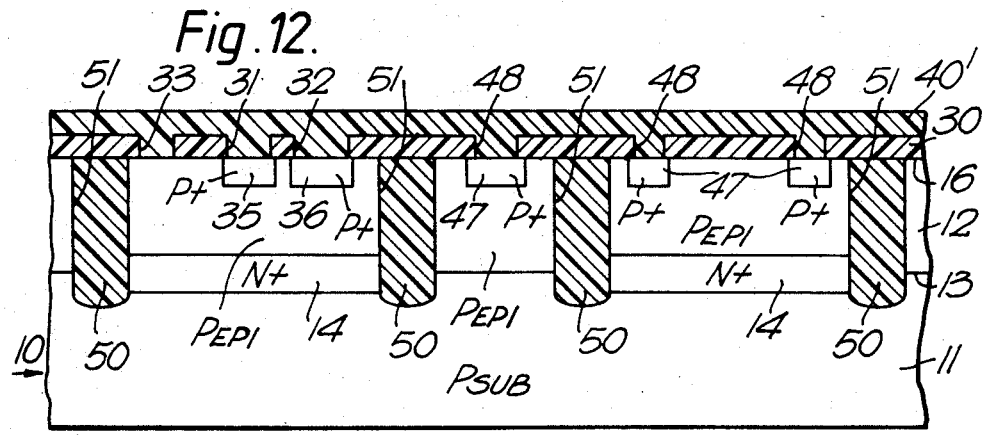

SEMICONDUCTOR DEVICE CONTAINING BIPOLAR TRANSISTOR FORMED BY METHOD INCLUDING THREE PHOTOLITHOGRAPHIC STEPS

This invention relates to methods of fabricating semiconductor devices, and to the semiconductor devices obtained thereby, and in particular to semiconductor devices each comprising an integrated circuit including at least one bipolar transistor, electrically isolated within the semiconductor body of the device, the semiconductor body comprising a substrate of one conductivity type with an epitaxial layer thereon, the collector of the bipolar transistor, of the opposite conductivity type, including a buried, heavily doped, layer at a part of the interface between the substrate and the epitaxial layer, and the arrangement being such that electrical contact is made to the buried layer via a collector contact region extending at least partially through the epitaxial layer from the surface of the epitaxial layer remote from the substrate, the bipolar transistor also including an emitter of the opposite conductivity type, a heavily doped base contact region, and a heavily doped base region, both of said one conductivity type, the latter heavily doped base region surrounding within the semiconductor body, and being contiguous with, the emitter, these constituent regions of the bipolar transistor, together with the collector contact region, all being adjacent to the surface of the epitaxial layer remote from the substrate, and being formed by introducing conductivity type determining impurities selectively into these regions of the semiconductor body from external of the semiconductor body, and into the surface of the epitaxial layer remote from the substrate.

During the fabrication of each such semiconductor device portions of the semiconductor body are modified by the introduction, in any known way, of conductivity type determining impurities therein, either from external of the semiconductor body of the device, or from other parts of the body, in different process steps of the method of fabricating the device. One such impurity may be characteristic of the same conductivity type as the epitaxial layer, and cause the portions of the epitaxial layer in which it is provided selectively to be more heavily doped than the unmodified parts of the epitaxial layer. Alternatively, or in addition, the impurity introduced may be characteristic of the opposite conductivity type to that of the epitaxial layer. Possibly impurities characteristic of both conductivity types are introduced into the same portion, or portions, of the epitaxial layer, possibly, in consecutive impurity introduction process steps. Thus, selected portions of the epitaxial layer may become of opposite conductivity type to, or remain the same conductivity type as, that of the unmodified parts of the epitaxial layer, and have any desired resistivity value, or impurity gradient therein. For convenience, in this specification, and the accompanying claims, portions of semiconductor bodies not having conductivity type determining impurities, introduced therein either from external of the semiconductor bodies, or from other parts of the bodies, are referred to as unmodified portions of the semiconductor bodies; and such introduction of conductivity type determining impurities into selected portions of the semiconductor bodies is referred to as modifying these portions, although the modified portions of the epitaxial layers are considered to comprise parts of the epitaxial layers.

In addition to including process steps by which conductivity type determining impurities are introduced into the semiconductor body of the device, the method of fabricating the semiconductor device includes known photolithographic process steps, using photo masks. In each of, at least some, such photolithographic process steps there is etched an aperture, or apertures, in a layer of resist material provided on the surface of the epitaxial layer remote from the substrate, the layer of resist material being capable of acting as a barrier to prevent the introduction of conductivity type determining impurities into the surface of the epitaxial layer remote from the substrate, from external of the semiconductor body. In order that the yields associated with the manufacture of the semiconductor device are as high as possible, inter alia, it is desired that the number of constituent photolithographic process steps in the method is as small as possible.

In the fabrication of an advantageous small geometry bipolar transistor it is essential that, adjacent to the surface of the epitaxial layer remote from the substrate, the emitter, the base contact region, and at least the portion of the collector contact region, adjacent to the surface, are precisely located in relation to each other. Each of these three constituent regions of the bipolar transistor is provided by introducing a conductivity type determining impurity into the surface of the semiconductor body selectively where the region is required, other portions of the epitaxial layer adjacent to the surface being covered with a layer, or layers, of resist material effectively preventing the simultaneous introduction of the impurity into these regions. The locations of the three constituent regions of the bipolar transistor referred to above, thus, are determined by corresponding apertures in the layer, or layers, of the resist provided on the surface of the epitaxial layer, effectively, conductivity type determining impurities being capable of being introduced into the epitaxial layer only though the apertures. Hence, in order to ensure that all the three constituent regions of the bipolar transistor referred to above are precisely located in relation to each other, it is required that the corresponding apertures in the layer, or layers, of the resist are precisely located in relation to each other.

As stated above, the apertures in the layer, or layers, of the resist are formed by employing known photolithographic techniques, using a photo mask, or masks. Each mask employed can be accurately made; and the location of each aperture provided in the resist is determined by the location of the associated mask relative to the surface of the epitaxial layer in a photolithographic process step. However, when a plurality of photolithographic process steps are required, in sequence, for the provision of the desired apertures in the layer, or layers, of resist in the fabrication of a semiconductor device, with a corresponding number of masks being employed, it is difficult to locate the latter masks in the seqence to the required degree of accuracy in relation to the locations of the preceding masks, relative to the surface of the semiconductor body, even when as much care as can be employed practically is used to ensure that this criterion is obtained.

Hence, for example, if two or more conductivity type determining impurities are to be introduced sequentially into the semiconductor body, through apertures in resist material, in the fabrication of a semiconductor device, it is desirable to employ one or more coarse photolithographic process steps in the sequence, after a preceding photolithographic process steps, in order to enable such introduction of impurities to be obtained. The term "coarse photolithographic process step" is used in this specification and accompanying claims to indicate that as much care as can be employed practically need not be used in the photolithographic process step to ensure that the photo mask is accurately located in relation to the location of the photo mask, or photo masks, employed in the preceding photolithographic process step, or steps, relative to the surface of the semiconductor body. In contrast, the term "precise photolithographic process step" is used to indicate that as much care as can be employed practically has been used in the photolithographic process step to ensure that the photo mask is accurately located in relation to the location of the photo mask, or photo masks, employed in the preceding photolithographic process step, or steps, relative to the surface of the semiconductor body. The preceding photolithographic process step, or steps, in such a sequence of photolithographic process steps, desirably, each need not be considered as either a coarse, or a precise, photolithographic process step.

Hence, it is known in fabricating a semiconductor device to avoid the difficulty stated above by employing, in sequence, at least one photolithographic process step, followed by at least one coarse photolithographic process step, in which latter step it is not necessary to locate the mask employed accurately in relation to the location of the mask employed in the preceding photolithographic process step, or steps, relative to the surface of the semiconductor body. In particular, in such a method of fabricating a semiconductor device, all the desired apertures, required to be provided in the resist by the plurality of appropriate photolithographic process steps in the sequence, are provided in a, usually initially continuous, layer of a first resist, on the surface of the epitaxial layer, in the preceding photolithographic process step, or steps. Next a, usually initially continuous, layer of a second resist of a different material to that of the first resist, is provided on the surface of the semiconductor body, over the apertured layer of first resist. The aperture, or each aperture, initially required in the, composite, resist then is provided by employing the coarse photolithographic process step, in which process step there is provided in the layer of second resist an aperture larger than the required aperture in the composite resist, and is provided so that the whole of the required, accurately located, corresponding aperture in the layer of first resist is exposed. The etchant for the second resist material, as used in the coarse photolithographic process step is required, simultaneously, not to etch at a significant rate the first resist material. Because the aperture provided in the layer of second resist is larger than the corresponding, accurately located, aperture in the layer of first resist, it is not required that the mask employed in the coarse photolithographic process step is accurately located in relation to the location of the mask, or masks, employed in the preceding precise photolithographic process step, or steps, relative to the surface of the semiconductor body. Subsequently, the constituent process step, employing each then exposed aperture in the layer of first resist, in the fabrication of the semiconductor device, is completed. Then, for example, the, or some of the, other, precisely located apertures in the layer of first resist are exposed. If all the apertures in the layer of first resist are to be exposed, the layer of second resist is removed. Next, another constituent process step, employing the then exposed aperture, or apertures, in the layer of first resist, in the fabrication of the semiconductor device, is completed.

It is an object of the present invention to provide novel and advantageous methods of fabricating semiconductor devices each including a bipolar transistor electrically isolated within the semiconductor body of the device, and to provide novel and advantageous semiconductor devices obtained thereby, the semiconductor body comprising a substrate of one conductivity type with an epitaxial layer thereon, the collector of the bipolar transistor, of the opposite conductivity type, including a buried, heavily doped, layer at a part of the interface between the substrate and the epitaxial layer, and the arrangement being such that electrical contact is made to the buried layer via a collector contact region extending at least partially through the epitaxial layer from the surface of the epitaxial layer remote from the substrate, the bipolar transistor also including an emitter of the opposite conductivity type, a heavily doped base contact region, and a heavily doped base region, both of said one conductivity type, the latter heavily doped base region surrounding within the semiconductor body, and being contiguous with, the emitter, these constituent regions of the bipolar transistor, together with the collector contact region, all being adjacent to the surface of the epitaxial layer remote from the substrate, and being formed by introducing conductivity type determining impurities selectively into these regions of the semiconductor body, to modify the regions, from external of the semiconductor body, and into the surface of the epitaxial layer remote from the substrate, and the method including opening of apertures in a layer of passivating material for electrodes to the contact regions, and to the emitter, by employing only three photolithographic process steps, in a sequence, including one, or two, coarse photolithographic process steps.

According to the present invention in a method of fabricating a semiconductor device including a bipolar transistor electrically isolated within a semiconductor body, the semiconductor body comprising a substrate of one conductivity type with an epitaxial layer thereon, the collector of the bipolar transistor, of the opposite conductivity type, including a buried, heavily doped, layer at a part of the interface between the substrate and the epitaxial layer, there being a method part wherein are formed, by modifying selected portions of the semiconductor body, a heavily doped emitter, a heavily doped base contact region, a heavily doped base region surrounding within the semiconductor body, and being contiguous with, the emitter, and a collector contact region spaced from the base contact region, said method part including providing on the surface of the epitaxial layer remote from the substrate initially continuous layers of a first resist material and of a second resist material, each provided layer of resist material being capable of acting as a barrier for conductivity type determining impurity, the second resist material capable of being attacked by an etchant relatively inactive with the first resist material, and the first resist material comprising passivating material for the completed device, said method part also including forming three apertures in a layer of first resist material in either a first or a second photolithographic process step, to expose selectively at least part of each of the body portions to become the emitter and the two contact regions, then before each, or the, remaining photolithographic process step of a sequence of only three photolithographic process steps in the method part, providing on the so apertured layer of first resist material an initially continuous layer of second resist material, each, or the, remaining photolithographic process step of the sequence comprising a coarse photolithographic process step, selectively removing parts of a layer of second resist material, to expose selectively two of the three apertures in the layer of first resist material, whereby there are exposed at least part of the body portion to become the emitter, together with, at least part of the body portion to become the collector contact region by the third photolithographic process step, and at least part of the body portion to become the base contact region if there is a coarse, remaining, second photolithographic process step of the sequence, and introducing conductivity type determining impurity, characteristic of said one and said opposite conductivity types, into the semiconductor body, through at least two of the three apertures in the layer of first resist material, after, respectively, the second and third photolithographic process steps of the sequence, thereby completing, by at least partially modifying the selected portions of the semiconductor body.

Conveniently, the semiconductor body is of Silicon, the first resist material is Silicon Oxide, and the second resist material is Silicon Nitride.

In one embodiment of a method in accordance with the present invention there is formed a collector contact region extending through the epitaxial layer to contact the heavily doped buried layer of the collector, and there are provided unmodified portions of the epitaxial layer of said one conductivity type, the collector contact region also comprising an isolation barrier, which, together with the buried layer, isolates the bipolar transistor within the semiconductor body, in said method part there being provided an initial, initially continuous, layer of first resist material, in the first photolithographic process step of the sequence forming an aperture therein to expose selectively at least part of the body portion to become the collector contact region, introducing a conductivity type determining impurity characteristic of said opposite conductivity type into the semiconductor body through the sole aperture in the layer of first resist material, then there being provided a subsequent, initially continuous, layer of first resist material, for example, by growing first resist material within the sole aperture, or by stripping away the initial layer and depositing a different subsequent layer, in the second photolithographic process step of the sequence, forming the three apertures in the layer of first resist material, introducing a conductivity type determining impurity characteristic of said one conductivity type into the semiconductor body through the three apertures in the layer of first resist material, providing the sole initially continuous layer of second resist material on the so apertured layer of first resist material, after the coarse, third photolithographic process step of the sequence, in which parts of the layer of second resist material are removed selectively, there is introduced a conductivity type determining impurity characteristic of said opposite conductivity type into the semiconductor body through the exposed two apertures in the layer of first resist material.

In another embodiment of a method in accordance with the present invention there is provided an isolation barrier of dielectric material extending through the epitaxial layer, the isolation barrier together with the heavily doped buried layer of the collector isolating the bipolar transistor within the semiconductor body, in said method part there being provided a sole layer of first resist material, in the first photolithographic process step of the sequence there being formed the three apertures in the layer of first resist material, then there is provided an initial, initially continuous, layer of second resist material on the so apertured layer of first resist material, in the coarse, second photolithographic process step of the sequence, in which parts of the initial layer of second resist material are removed, to expose selectively an initial pair of the three apertures in the layer of first resist material, there being exposed at least part of the body portion to become the emitter, and at least part of the body portion to become the base contact region, and there is introduced a conductivity type determining impurity characteristic of said one conductivity type into the semiconductor body through the exposed initial pair of apertures in the layer of first resist material, then the initial layer of second resist material is removed, and there is provided a further, initially continuous, layer of second resist material on the apertured layer of first resist material, in the coarse, third photolithographic process step of the sequence, in which parts of the further layer of second resist material are removed, to expose selectively a further pair of the three apertures in the layer of first resist material, there being exposed at least part of the body portion to become the emitter, and at least part of the body portion to become the collector contact region, and there is introduced a conductivity type determining impurity characteristic of said opposite conductivity type into the semiconductor body through the exposed further pair of apertures in the layer of first resist material.

In the latter method there may be provided unmodified portions of the epitaxial layer of said one conductivity type, together with a collector contact region extending through the epitaxial layer to contact the heavily doped buried layer of the collector. Alternatively, there may be provided unmodified portions of the epitaxial layer of said opposite conductivity type, and a heavily doped base contact region contiguous with the heavily doped base region surrounding within the semiconductor body, and being contiguous with, the emitter, together with a collector contact region, which either extends through the epitaxial layer to contact the heavily doped buried layer of the collector, or which does not extend so far into the epitaxial layer, but with either arrangement the collector contact region, desirably, extending further into the epitaxial layer than the emitter.

In accordance with another aspect, the present invention comprises a semiconductor device fabricated by a method referred to above.

The present invention will now be described by way of example with reference to the accompanying drawings, each constituent Figure of the drawings comprising a sectional elevation of part of the semiconductor body of a desired semiconductor device, the illustrated part of the body, either to be provided with, or having, a bipolar transistor T and a resistor R.

DETAILED DESCRIPTION OF THE FIGURES

Figure 1:
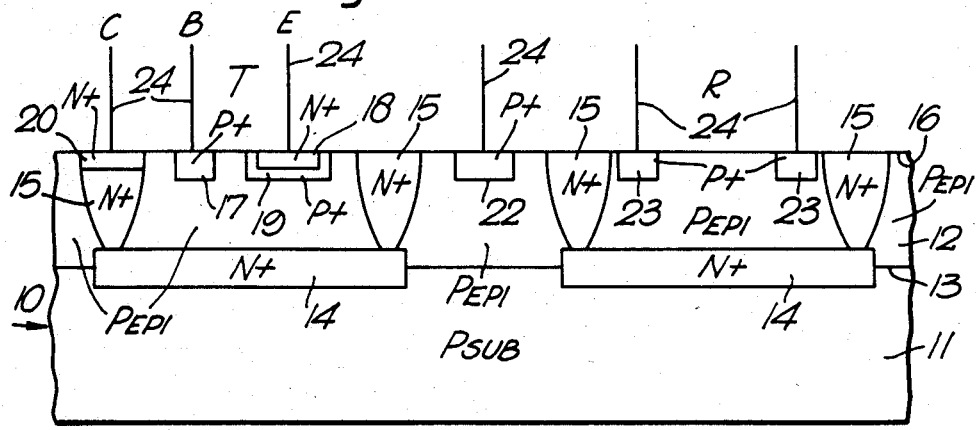
FIG. 1 shows one required general form of construction for the illustrated part of the desired device, FIGS. 2 to 7 each shows an intermediate stage of a method, in accordance with the present invention, of fabricating a desired device, of the same general form as that shown in FIG. 1, FIGS. 8 to 13 correspond to FIGS. 2 to 7, but illustrate partially an alternative method, in accordance with the present invention, of fabricating a semiconductor device having a similar general form as that shown in FIG. 1, and FIGS. 14 to 19 correspond to FIGS. 8 to 13, but show a modification, in accordance with the present invention, of the method of FIGS. 8 to 13.

The semiconductor device, in a Silicon semiconductor body, and shown partially in FIG. 1, has a bipolar transistor T having the so-called collector-diffusion-isolation construction, the semiconductor body 10 having a substrate 11 of P conductivity type, and an epitaxial layer 12 initially wholly of P type. At the interface 13 between the substrate 11 and the epitaxial layer 12 are provided spaced apart, heavily doped buried layers 14 of N+ conductivity type. Isolation barriers 15 for the constituent circuit elements of the semiconductor device are provided by heavily doped N+ type regions, each extending through the epitaxial layer 12 to contact individually an N+ type buried layer 14. For a bipolar transistor T, the N+ type buried layer 14 comprises part of the collector, and the N+ type isolation barrier 15 comprises the deep, collector contact region. The unmodified region of the P type epitaxial layer 12, surrounded by the isolation barrier 15, comprises the transistor base. The bipolar transistor T is isolated electrically within the semiconductor body 10 by the combination of the deep collector contact region/isolation barrier 15 and the heavily doped buried layer 14. At the surface 16 of the epitaxial layer remote from the substrate, and within the isolation barrier, there are provided a heavily doped, shallow, P type base contact region 17, and a heavily doped, shallow, N type emitter 18. Conventionally, the portion 19 of the base adjacent to the emitter 18 is also heavily doped. In known forms of collector-diffusion-isolation bipolar transistors the portion 20 of the deep collector contact region isolation barrier 15 adjacent to the surface 16 of the epitaxial layer, and on which an electrode is to be provided, is heavily doped simultaneously with the provision of the heavily doped emitter 18. Whether this additional doping of the surface portion 20 of the deep collector contact region/isolation barrier 15 is provided, or not, the surface portions of the deep collector contact region/isolation barrier is required to be heavily doped, as when the region/barrier is formed by diffusion of impurity from the vapour phase into the surface 16 of the epitaxial layer, so that the required ohmic contact can be made thereto.

Also shown in FIG. 1, as part of the semiconductor device, integrated with the collector-diffusion-isolation bipolar transistor T, and formed by the same process steps as, simultaneously with, the collector-diffusion-isolation transistor T, is a resistor R; and a P+ type contact region 22 so that electrical contact may be made thereby, via the adjacent unmodified P type region of the epitaxial layer 12, to the P type substrate 11. The resistor R can have two possible forms, the illustrated construction having two, spaced, heavily doped, P+ type surface contact regions 23, the required resistance being provided between the two contact regions 23 by an unmodified P type region of the epitaxial layer 12; the unillustrated construction having a single heavily doped, P+ type surface region, to which contact is made at two spaced points by electrodes, the required resistance being provided between the two electrodes by the P+ type surface region. With either such construction for the resistor R, the resistor is electrically isolated from the remaining parts of the semiconductor device by the provision of a buried N+ type layer 14 at the interface 13 between the substrate 11 and the epitaxial layer 12, together with an N+ type isolation barrier 15 extending through the epitaxial layer 12 to contact the N+ type buried layer 14.

When the device of FIG. 1 is completed a layer of dielectric, passivating material (not shown in FIG. 1) in FIG. 1, is on the surface 16 of the epitaxial layer 12, and electrodes are provided to the surface regions 17, 18, 20, 22 and 23 through apertures in the passivating layer. These electrodes are indicated generally in FIG. 1 by the leads 24, the emitter, base and collector electrodes of the bipolar transistor T also being designated, respectively, 'E', 'B' and 'C'.

In the fabrication of the device of FIG. 1, conductivity type determining impurities are introduced, in known ways, from external of the semiconductor body 10, into the surface 16 of the epitaxial layer 12. In particular, in a known way of fabricating the semiconductor device, the N+ type isolation barriers 15 are so formed; then the impurity for the P+ type base contact region 17, the base region 19, and the contact regions 22 and 23 is introduced; and, finally, the impurity for the N+ type emitter 18 and the surface portion 20 of the collector contact region 15 is introduced.

The semiconductor device shown partially in FIG. 1 comprises one required general form for a desired semiconductor device to which the present invention relates. In particular, any required general form for the desired semiconductor device comprises being formed in a semiconductor body 10 having a substrate 11 of one conductivity type with an epitaxial layer 12 thereon. Included within the device is a bipolar transistor T which is electrically isolated within the semiconductor body. The collector of the transistor, of the opposite conductivity type, includes a buried, heavily doped, layer 14 at the interface 13 between the substrate 11 and the epitaxial layer 12, and the arrangement is such that electrical contact is made to the buried layer 14 via a collector contact region 15 extending at least partially through the epitaxial layer 12 from the surface 16 of the epitaxial layer remote from the substrate. The bipolar transistor T also includes an emitter 18 of the opposite conductivity type, a heavily doped base contact region 17, and a heavily doped base region 19, both of said one conductivity type, the heavily doped base region 19 surrounding within the semiconductor body, and being contiguous with, the emitter 18, all these constituent regions of the bipolar transistor T, together with the surface portion 20 of the collector contact region 15, all being adjacent to the surface 16 of the epitaxial layer 12, and being formed by introducing conductivity type determining impurities selectively into these regions of the semiconductor body from external of the semiconductor body, and into the surface 16 of the epitaxial layer. Electrodes are provided to the contact regions 15, 17, and to the emitter 18, through apertures in a layer of passivating layer (not shown) on the surface 16 of the epitaxial layer 12.

A method in accordance with the present invention of fabricating a desired semiconductor device of the required general form of construction referred to in the preceding paragraph, and, in particular, of the general form of construction shown in FIG. 1, causes the introduction of conductivity type determining impurities selectively into the surface portion 20 of the collector contact region 15, the emitter 18, the base contact region 17, and the heavily doped base region 19 surrounding within the semiconductor body, and being contiguous with the emitter 18, and causes the opening of apertures in a layer of passivating material for electrodes to the contact regions 15 and 17, and to the emitter 18, by employing only three photolithographic process steps, in a sequence, including one, or two, coarse photolithographic process steps.

A method in accordance with the present invention of fabricating a desired semiconductor device of the required general form of construction as that shown in FIG. 1 will now be described with reference to FIGS. 2 to 7; parts of the semiconductor device so manufactured identical to, or closely resembling, parts of the semiconductor device of FIG. 1, being identified by the same reference numerals as in FIG. 1.

In the method in accordance with the present invention the provision of the N+ type buried layers 14; and the N+ type deep collector contact region/isolation barriers 15, except for the heavily doped surface portion 20 of the collector contact region 15; are provided, initially, in a known manner.

Initially, in describing further the method in accordance with the present invention, only the fabrication of the bipolar transistor T will be referred to, the fabrication of other constituent circuit elements of the semiconductor device being obtained simultaneously with, and by employing the same constituent process steps as, the method of fabricating the bipolar transistor T.

Figure 2:
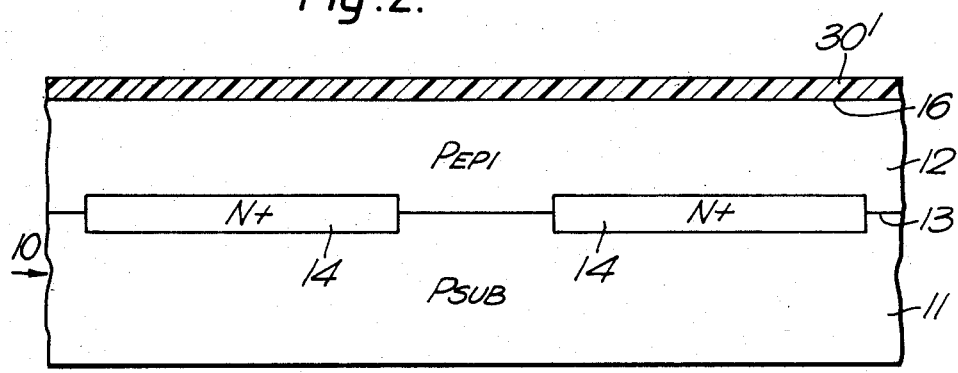
Figure 3:
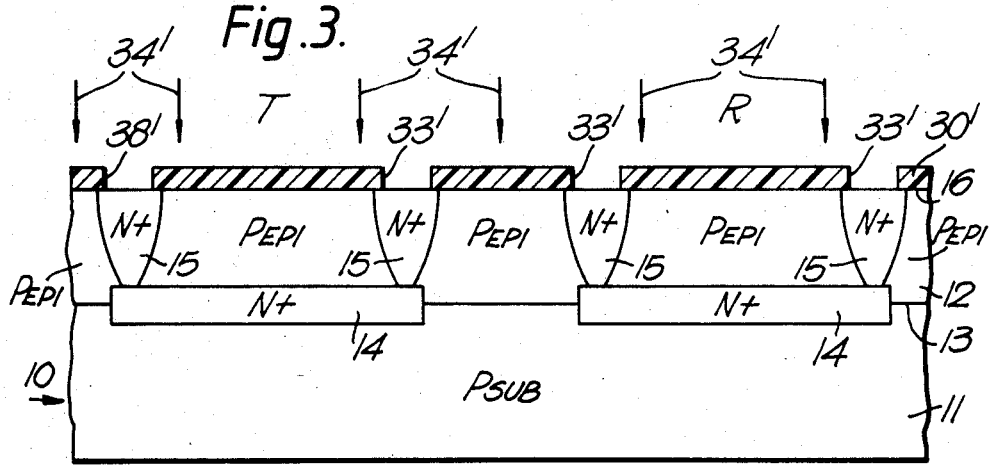

As shown in FIG. 2, an initial, initially continuous, layer 30' of first resist material, also comprising passivating material, such as Silicon Oxide, is provided, in any known manner, on the otherwise exposed surface 16 of the epitaxial layer 12 remote from the substrate 11. As shown in FIG. 3, in the known, first photolithographic process step, which need not be considered as either a precise, or a coarse, photolithographic process step, there is provided an aperture 33' in the initial first resist layer 30' whereby there is exposed part of the region of the semiconductor body to become the collector contact region 15. The portions of the first resist layer 30' remaining on the surface 16 of the epitaxial layer 12 are an effective barrier to the introduction of impurity into the portions of the epitaxial layer covered thereby in a subsequent impurity introduction process step. Then a donor impurity such as Phosphorus is introduced selectively into the portion of the semiconductor body exposed through the aperture 33' in the initial first resist layer 30'. The introduction of the impurity is in a known manner, and may comprise diffusion from the vapour phase, or an ion implantation process step; such as introduction of Phosphorous being indicated generally by the arrows 34' in FIG. 3. Conventionally, any impurity introduction process step is followed by a drive-in process step, which drive-in process step, in the case of preceding impurity introduction by employing ion implantation, is also an annealling process step. By the Phosphorus introduction process step, and by the subsequent process steps in the method of fabricating the device, there is provided the desired collector contact region 15. For convenience, the collector contact region 15 in its completed form is shown in FIG. 3, which may comprise substantially the form of the Phosphorus doped region after the drive-in process step. In any event, the completed N+ type collector contact region 15 is required to extend through the P type epitaxial layer 12 to contact the N+ type buried layer 14 of the collector.

As shown in FIG. 4, there is then provided a subsequent, initially continuous, layer 30 of first resist material, in any known manner, on the otherwise exposed surface 16 of the epitaxial layer 12 remote from the substrate 11. For example, Silicon Oxide, first resist material, may be grown in the aperture 33' of the initial layer 30', either during the impurity process step, or otherwise, in order to convert the initial layer 30' to the subsequent layer 30 of first resist material. Alternatively, the apertured initial layer 30' of first resist material may be removed from the semiconductor body, and a different, subsequent layer 30 of first resist material is provided, in any known manner.

As shown in FIG. 5, in a known, second photolithographic process step three spaced apertures 31, 32 and 33 are provided in the subsequent first resist layer 30. One aperture 31 exposes partially the region 17 of the epitaxial layer where the P+ type base contact region is required. Another aperture 32 exposes partially the region 18 of the epitaxial layer where the N+ type emitter is required; and the remaining aperture 33 exposes partially a surface portion of the N+ type deep collector contact/isolation barrier 15 where a shallow N+ type portion 44 (shown in FIG. 7), is required to be formed simultaneously with the provision of the emitter 18. Because the three desired apertures 31, 32 and 33 are formed in a single photolithographic process step, the locations of the apertures in relation to each other are accurately determined, as is required for an advantageous small geometry bipolar transistor T. It is required that the portions of the first resist layer 30 remaining on the surface 16 of the epitaxial layer 12 are an effective barrier to the introduction of impurity into the portions of the epitaxial layer covered thereby, in a subsequent impurity introduction process step, or steps. The photolithographic process step employed in the formation of the three apertures 31, 32 and 33, comprising the second such step in the sequence of three photolithographic process steps, inherently is such that it does not need to be considered as either a precise, or a coarse, photolithographic process step after the initial photolithographic process step employed in the initial introduction of impurity into the deep collector contact region/isolation barrier 15.

After the second photolithographic process step, and as also is shown in FIG. 5, an acceptor impurity such as Boron is introduced selectively into the portions of the semiconductor body 12 exposed through the three apertures 31, 32 and 33 in the layer of first resist 30. The introduction of the impurity is in a known manner, and may comprise diffusion from the vapour phase or an ion implantation process step; such an introduction of Boron being indicated generally by the arrows 34 in FIG. 5. Conventionally, any impurity introduction process step is followed by a drive-in process step, which drive-in process step, in the case of preceding impurity introduction by employing ion implantation, is also an annealling process step. In particular, a P+ type zone 35 within the required base contact region 17, and a P+ type zone 36 beneath the aperture 32, are provided. Further, as also is shown in FIG. 5, a P− type zone 38 is provided in the surface portion of the previously heavily doped N+ type deep collector contact region 15. The zone 38, instead of being converted to P conductivity type as shown, may remain of N conductivity type, but this is unimportant. However, the zone 30 is unlikely to remain heavily doped N+ type, which criterion is required in order to make ohmic contact thereto.

It is required to ensure that the subsequently provided P+ type base contact region 17, and the P+ type base region 19 surrounding the emitter 18, do not become contiguous with the N+ type collector contact region 15. However, with normally employed process steps for the fabrication of the semiconductor device, and with the requirements that the collector, base and emitter electrodes, are spaced apart, and have the conventionally obtainable minimum lateral dimensions for these electrodes, it is not difficult to ensure that P+ type base contact region 17, and the P+ type base region 19 surrounding the emitter 18 do not become contiguous with the N+ type collector contact region 15.

As shown in FIG. 6, the apertured first resist layer 30 is then covered by a sole, initially-continuous, layer of a second resist material 40, which is an effective barrier to the introduction of impurity into the semiconductor body, but which is capable of being etched by an etchant which does not etch at a significant rate, simultaneously, in a subsequent photolithographic process step, the first resist material 30. Thus, for example, when the first resist material 30 is Silicon Oxide, the second resist material 40 may be a commercially available photoresist capable of being employed in a photolithographic process step; or Silicon Nitride. The second resist layer 40 is provided in a known manner.

Figure 7:
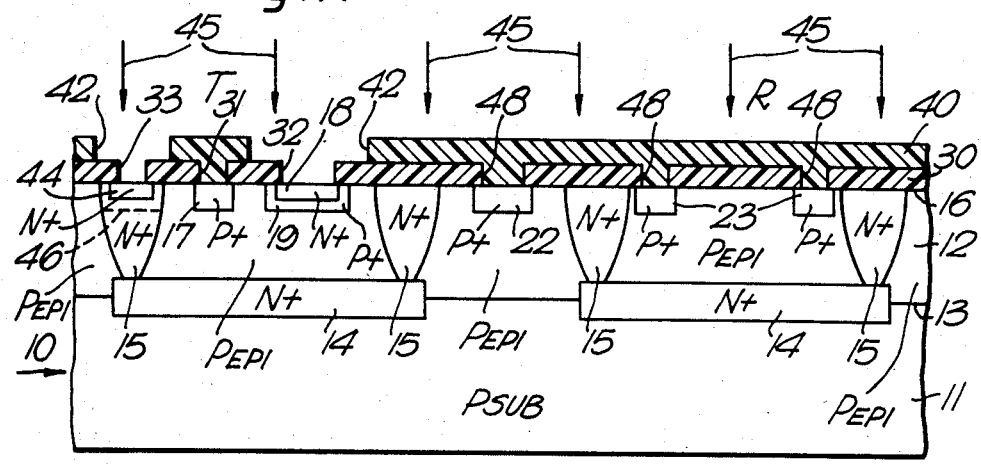

As shown in FIG. 7, an aperture, or apertures, 42, are then provided in the second resist layer 40 by employing a known coarse photolithographic process step, comprising the final photolithographic process step in the sequence of three photolithographic process steps, and so as to expose the two apertures 32 and 33 of the three apertures previously provided in the first resist layer 30. In particular, there is exposed thereby the portions of the semiconductor body in which the emitter 18, and the heavily doped surface portion 44 of the collector contact region 15 to be formed simultaneously with the emitter, are to be provided. The, or each, aperture 42 provided in the second resist layer 40 by the third, coarse photolithographic process step is larger than the required aperture in the composite resist 30, 40, and is provided so that the whole of the required, accurately located, corresponding aperture 32 or 33 in the first layer of resist 30 is exposed. Thus, the photo mask employed in the third, coarse photolithographic process step is not required to be accurately located in relation to the location of the masks employed in the preceding photolithographic process steps, relative to the surface of the semiconductor body.

Further, it is required that the portions of the second resist layer 40 remaining on the first resist layer 30, and, in particular, remaining within the aperture 31 in the first resist layer 30, are an effective barrier to the introduction of impurity into the portions of the epitaxial layer covered thereby, in a subsequent impurity introduction process step.

Next, as also is shown in FIG. 7, a donor impurity, such as Phosphorus, is introduced selectively into the portions of the epitaxial layer 12 exposed through the two apertures 32 and 33 in the first resist layer 30, exposed through the apertures 42 in the second resist layer 40. The impurity may be introduced in any known way, and may comprise diffusion from the vapour phase, or an ion implantation process step; such an introduction of Phosphorus being indicated generally by the arrows 45 in FIG. 7. In this manner the N+ type emitter 18 is formed beneath the aperture 32 in the first resist layer 30, and the N+ type surface portion 44 of the deep collector contact region 15 is provided beneath the aperture 33 in the first resist layer 30. The emitter 18 is surrounded within the semiconductor body by the desired P+ type region 19, caused by the previous introduction of Boron, and by the push-on of the Boron caused by the subsequent introduction of Phosphorus, though the aperture 32. Effective ohmic contact can be made to the collector contact region 15 through the aperture 33 in the first resist layer 30, by the provision of the N+ type surface portion 44 of the deep collector contact region 15. The Boron previously introduced into the deep collector contact region 15 is indicated as being present in a portion bounded by the dotted line 46, but is indicated as not preventing the required collector contact being provided, the process in accordance with the present invention being arranged to be such that this criterion is obtained.

Subsequently, but not illustrated, the semiconductor device is completed by the removal of the second resist material 40, and the provision of electrodes, (indicated in FIG. 1) in the apertures 31, 32 and 33 in the first resist layer 30, the first resist material also comprising passivating material.

Simultaneously with the fabrication of the bipolar transistor T, as described above, the other constituent circuit elements of the semiconductor device are completed, by employing the same process steps. In the illustrated part of the semiconductor device, and in particular as shown in FIGS. 5 and 7, the P+ type contact region 22 by way of which electrical contact is made to the substrate 11, and the two spaced P+ type resistor contact regions 23, are formed in the same manner as the base contact region 17 of the bipolar transistor T. The Boron is introduced initially into zones 47 of the epitaxial layer 12, through apertures 48 in the first resist layer 30, simultaneously with the formation of the zones 35, 36 and 38 in relation to the fabrication of the bipolar transistor T, as shown in FIG. 5, the Boron in the zones 47 eventually forming the required P+ type contact regions 22 and 23 as shown in FIG. 7. The apertures 48 are formed simultaneously with the apertures 31, 32 and 33. The N+ type buried layer 14 and isolation barrier 15 of the resistor R are formed in the same manner as, respectively, the buried layer 14 and deep collector contact region/isolation barrier 15 of the bipolar transistor T.

Many different variants of this method of fabricating a semiconductor device are possible.

In the bipolar transistor T it may be arranged that the P+ type base contact region 17 is contiguous with the P+ type region 19 surrounding the emitter 18. Hence, the process in accordance with the present invention may be arranged to ensure that this criterion is obtained.

The emitter 18 may be arranged to be between the base contact region 17 and the surface portion 44 of the deep collector contact region 15, at the surface 16 of the epitaxial layer.

A method in accordance with the present invention is applicable to the fabrication of semiconductor devices which have dielectric isolation provided between the constituent circuit elements, and which have a required general form of construction as stated above, and similar to that referred to above in relation to FIG. 1. The constituent circuit elements of the device are electrically isolated by the combination of the dielectric barriers 50 and the N+ type buried layers 14. In addition, when the constituent circuit elements are isolated partially by the provision of dielectric material, the second and third photolithographic process steps in the sequence comprise coarse photolitographic process steps.

One such method in accordance with the present invention of fabricating a semiconductor device of the required general form of construction similar to that shown in FIG. 1, but having dielectric isolation between the constituent circuit elements, is shown in FIGS. 8 to 13.

The part of the semiconductor device shown in FIGS. 8 to 13, has a bipolar transistor T', a resistor R, and an electrical connection to the substrate of the semiconductor body of the device, as in the part of the semiconductor device shown in FIGS. 2 to 7.

Parts of the semiconductor device of FIGS. 8 to 13 identical to, or closely resembling, parts of the semiconductor device of FIGS. 2 to 7, are identified by the same reference numerals as for the device of FIGS. 2 to 7.

Figure 8:
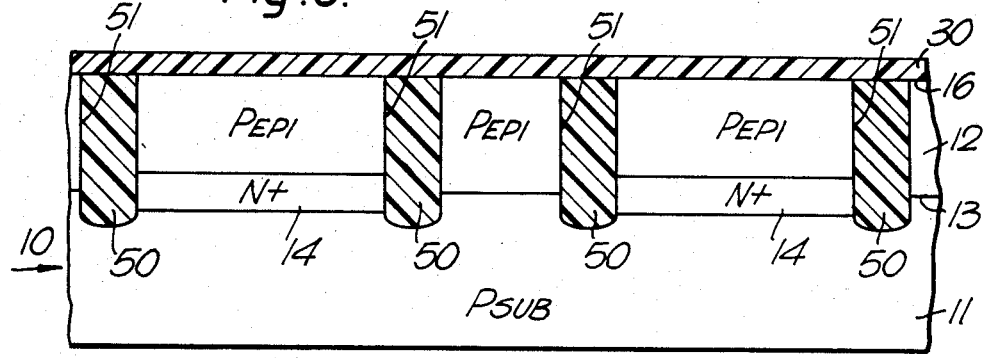

As shown in FIG. 8, the semiconductor body 10 comprises a P type substrate 11 and a P type epitaxial layer 12 provided thereon. At the interface 13 between the substrate 11 and the epitaxial layer 12 there are provided spaced apart heavily doped N+ type buried layers 14, provided in the known manner.

The dielectric isolation barriers 50 for the constituent circuit elements are provided by etching grooves 51 partially though the epitaxial layer 12 in any known way, for example, by employing a plasma ion etching process step. The grooves 51 extend towards the boundaries of the buried N+ type layers 14, but do not contact the buried layers. Then, in a known manner the Silicon of the semiconductor body between the bottom of the grooves and the interface 13 between the substrate 11 and epitaxial layer 12, selectively, is oxidised. The Silicon Oxide, dielectric, so formed fills the grooves 51, providing the required isolation barriers 50, contacting the buried layers 14.

Initially in describing further the method in accordance with the present invention only the fabrication of the bipolar transistor T' will be referred to.

Figure 9:
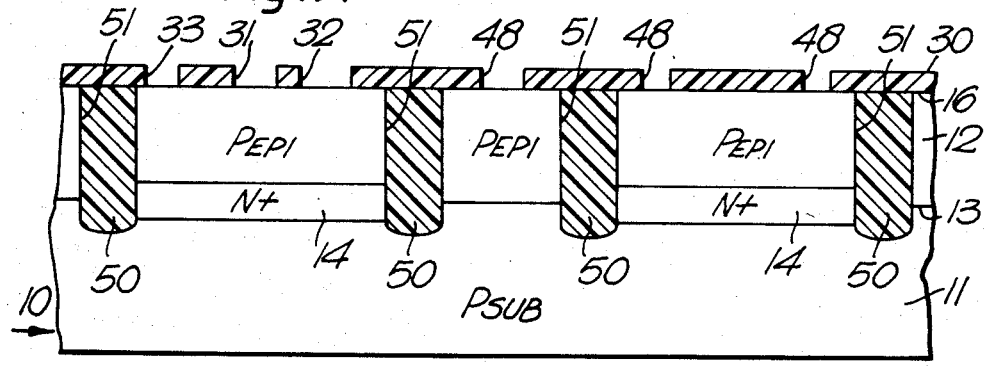
Figure 13:
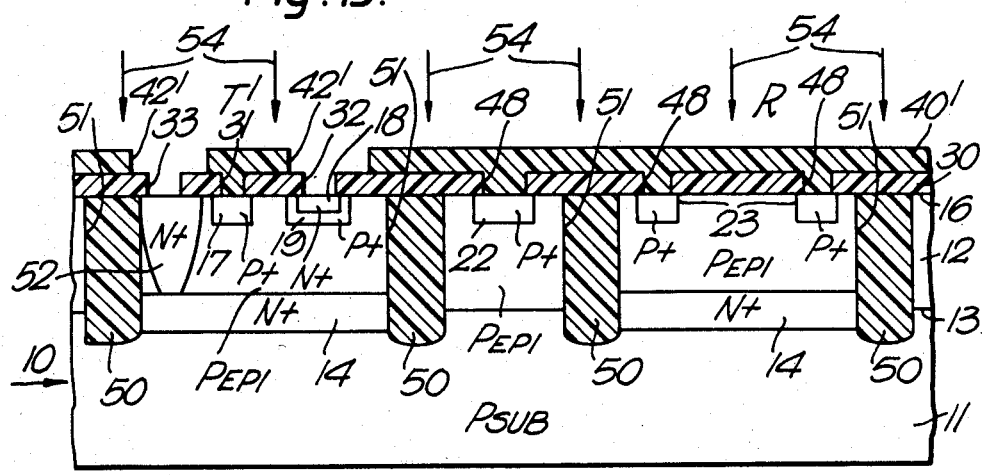

After the provision of the dielectric isolation barriers 50, and as also is shown in FIG. 8, a sole initially continuous layer of a first resist material 30, also comprising passivating material, is provided on the otherwise exposed surface 16 of the epitaxial layer 12 remote from the substrate 11, in any known manner. As shown in FIG. 9, in a known photolithographic process step, comprising the first photolithographic process step in the sequence of three such steps, in a method in accordance with the present invention, three spaced apertures 31, 32 and 33 are provided in the first resist layer 30. As shown in FIG. 13, one aperture 31 exposes partially the region 17 of the epitaxial layer where the P+ type base contact region is required; another aperture 32 exposes partially the region 18 of the epitaxial layer where the N+ type emitter is required; and the remaining aperture 33 exposes partially the region 52 of the epitaxial layer where the N+ type collector contact region is required. The locations of the apertures 31, 32 and 33 are accurately determined in relation to each other, but the first photolithographic process step need not be considered as either a coarse or a precise photolithographic process step. It is required that the portions of the first resist layer 30 remaining on the epitaxial layer 12 are an effective barrier to the introduction of impurity into the portions of the epitaxial layer covered thereby, in a subsequent impurity introduction process step, or steps.

As shown in FIG. 10, the apertured first resist layer 30 is covered by an initial, initially-continuous, layer of a second resist material 40, which is an effective barrier to the introduction of impurity into the semiconductor body, but which is capable of being etched by an etchant which does not etch at a significant rate, simultaneously in a subsequent photolithographic process step, the first resist material 30. As shown in FIG. 11, at least one aperture 42 is then provided in the initial second resist layer 40 by employing a known, coarse photolithographic process step, comprising the second photolithographic process step in the sequence of three photolithographic process steps, and so as to expose, selectively, the two apertures 31 and 32, of the three apertures previously provided in the first resist layer 30. In particular, there are exposed thereby, respectively, the portions of the epitaxial layer in which the heavily doped P+ type base contact region 17 and the N+ type emitter 18, are to be provided. The aperture 42 provided in the initial second resist layer 40 is larger than is required merely to expose the apertures 31 and 32 in the first resist layer 30. Hence, the photo mask employed in the second, coarse photolithographic process step is not required to be accurately located in relation to the location of the mask employed in the first photolithographic process step in the sequence, relative to the surface 16 of the semiconductor body.

After the second photolithographic process step, and as also is shown in FIG. 11, an acceptor impurity such as Boron is introduced selectively into the portions of the epitaxial layer 12 exposed through the two apertures 31 and 32 in the layer of first resist 30, and the aperture 42 in the layer of second resist 40. The introduction of the Boron is indicated by the arrows 34. A P+ type zone 35 within the required base contact region 17, and a P+ type zone 36 within the required N+ type emitter 18, are provided.

The initial layer of second resist 40 is then removed, and is replaced, as shown in FIG. 12, by a further, initially continuous layer 40' of the same second resist material as the layer 40. As shown in FIG. 13, at least one aperture 42' is then provided in the further second resist layer 40' by employing a known, coarse photolithographic process step, comprising the final photolithographic process step in the sequence of three photolithographic process steps, and so as to expose, selectively, the two apertures 32 and 33, of the three apertures previously provided in the first resist layer 30. In particular, there are exposed thereby, respectively, the portions of the epitaxial layer in which the N+ type emitter 18, and the N+ type collector contact region 52, are to be provided, The aperture 42' provided in the further second resist layer 40' is larger than is required merely to expose the apertures 32 and 33 in the first resist layer 30. Hence, the photo mask employed in the third, coarse photolithographic process step is not required to be accurately located in relation to the location of the masks employed by the preceding photolithographic process steps in the sequence of three such steps, relative to the surface 16 of the semiconductor body.

After the third photolithographic process step, and as also is shown in FIG. 13, a donor impurity such as Phosphorus is introduced selectively into the portions of the epitaxial layer 12 exposed through the two apertures 32 and 33 in the layer of first resist 30, and the aperture 42' in the further layer 40' of second resist. The introduction of the Phosphorus is indicated by the arrows 54. In this manner the N+ type emitter 18 is formed beneath the aperture 32 in the first resist layer 30. The emitter is surrounded within the semiconductor body by the desired P+ type region 19, caused by the previous introduction of Boron, and by the push-on of the Boron caused by the subsequent introduction of Phosphorus, through the aperture 32.' There is also formed by the introduction of the Phosphorus through the aperture 33 in the first resist layer 30 the required collector contact region 52. Because the Phosphorus introduced through the aperture 33 is not introduced into a heavily doped P+ type zone, as with the Phosphorus introduced through the aperture 32, the Phosphorus extends further into the epitaxial layer 12, than the Phosphorus introduced through the aperture 32. The method in accordance with the present invention is required to be arranged such that the Phosphorus introduced through the aperture 33 reaches the buried N+ type layer 14, forming the required deep collector contact region 52, of N+ type. Hence, the deep collector contact region 52 is formed simultaneously with the shallow emitter 18.

Subsequently, but not illustrated, the semiconductor device is completed by the removal of the further second resist layer 40', and the provision of electrodes (shown in FIG. 1), in the apertures 31, 32 and 33 in the first resist layer 30, the first resist material also comprising passivating material.

Simultaneously with the fabrication of the bipolar transistor T', as described above, the other constituent circuit elements of the semiconductor device are completed by employing the same process steps. In the illustrated part of the device, the P+ type contact region 22, by way of which electrical contact is made to the substrate 11, and the two spaced P+ type resistor contact regions 23, are formed in the same manner as the base contact region 17 of the bipolar transistor T', and otherwise as described above in relation to the semiconductor device of FIGS. 2 to 7.

A modification of the method of FIGS. 8 to 13, is shown partially in FIGS. 14 to 19. Parts of the semiconductor device of FIGS. 14 to 19 identical to, or closely resembling, parts of the semiconductor device of FIGS. 8 to 13, are identified by the same reference numerals as for the device of FIGS. 8 to 13.

Figure 14:
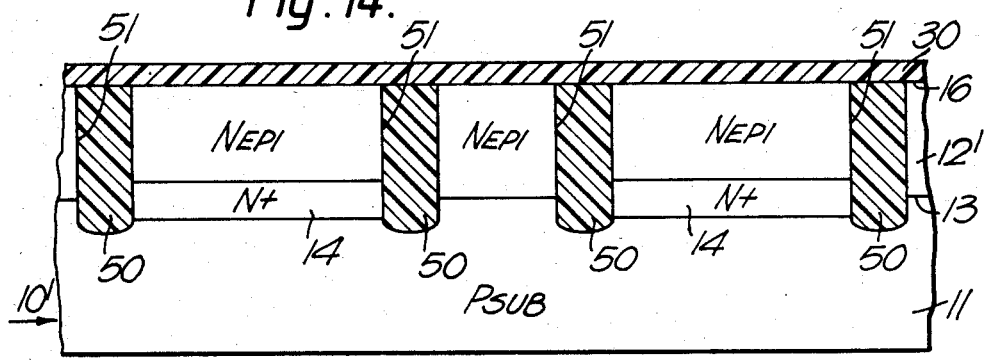
Figure 15:
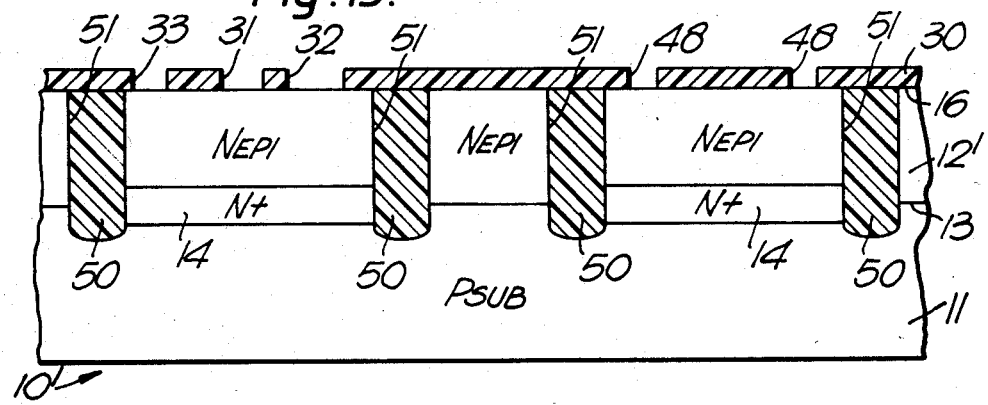
Figure 16:
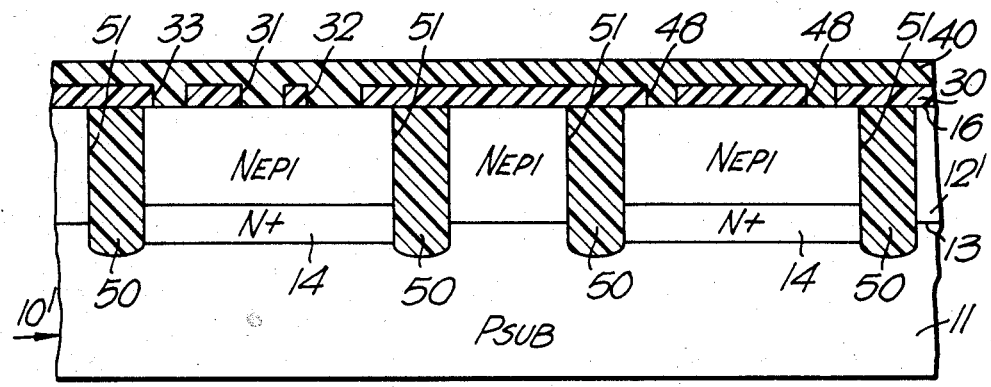
Figure 17:
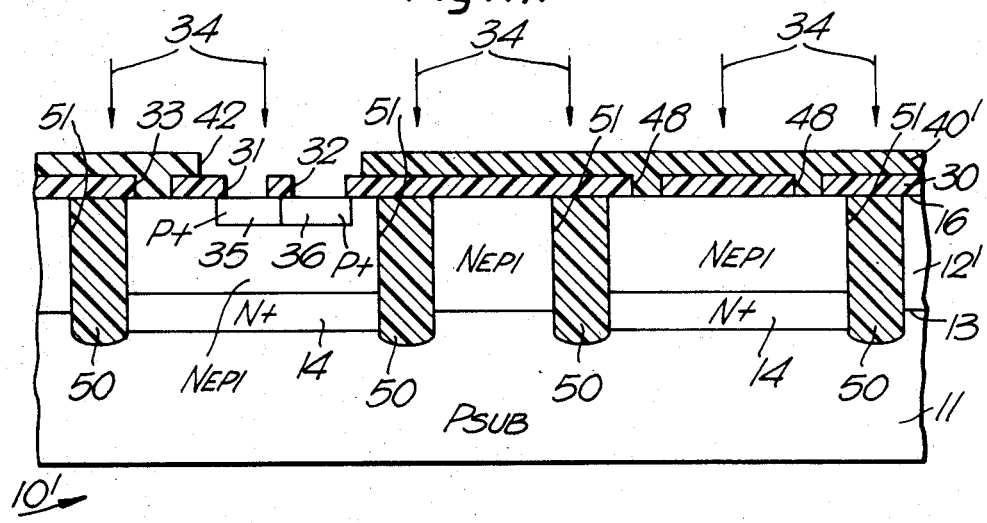
Figure 18:
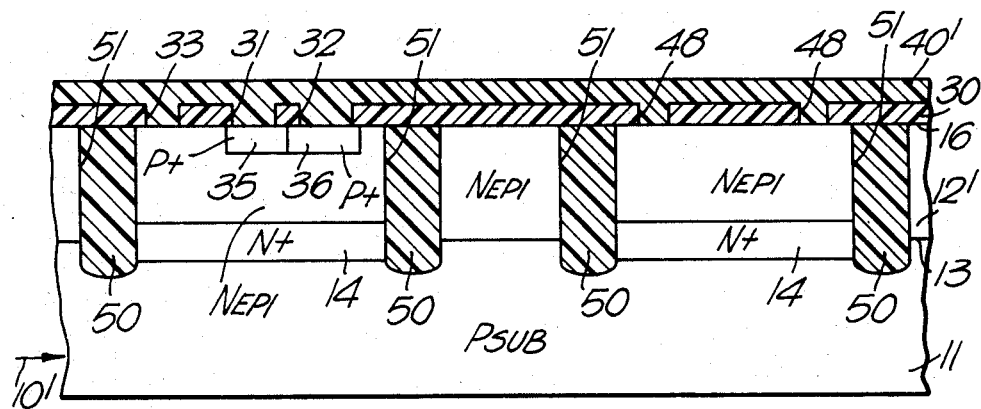

As shown in FIG. 14, the semiconductor body 10' comprises a P type substrate 11 and an N type epitaxial layer 12'. At the interface 13 between the substrate 11 and the epitaxial layer 12' are provided N+ type buried layers 14. The constituent circuit elements of the device are electrically isolated by the combination of the dielectric barriers 50 and the N+ type buried layers 14.

Figure 19:
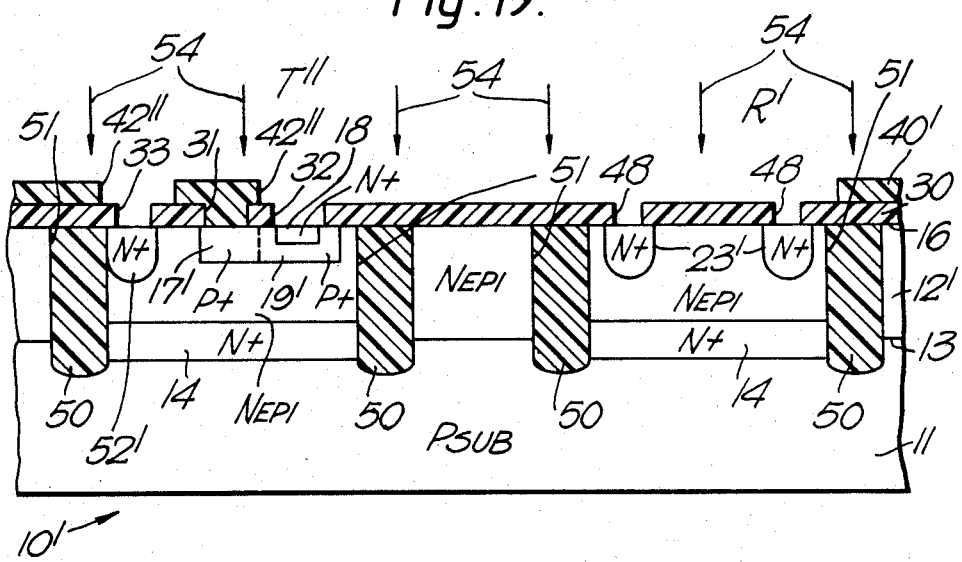

The method is then as described above with reference to FIGS. 8 to 13, except that it is essential, as shown in FIG. 19, that the heavily doped P+ type base contact region 17' for a bipolar transistor T" is formed to be contiguous with the heavily doped P+ type base region 19' surrounding the emitter 18. Further, because the N+ type collector contact region 52' is formed by modifying portions of an N type epitaxial layer 12', it is easier for the contact region 52' to extend deeper into the epitaxial layer 12' than the emitter 18, compared with the method of FIGS. 8 to 13. In this case however, it is not essential to arrange that the N+ type collector contact region 52' is contiguous with the buried N+ type layer 14.

Further, as shown in FIG. 19, which corresponds to FIG. 13, it is not possible to provide the heavily doped contact region 22 by way of which electrical contact is made to the substrate 11. The resistor R' requires N+ type contact regions 23', instead of the P+ type contact regions of FIG. 13. Consequently, the resistor contact regions 23' are formed simultaneously with the collector contact region 52'. The apertures 48 in the layer 30 of first resist material are not exposed after the second photolithographic process step, in the sequence of three photolithographic process steps. Instead, the apertures 48 are exposed after the third photolithographic process step in the sequence, through an aperture 42" formed in the further layer 40' of the second resist, by the third photolithographic process step. As illustrated in FIG. 19 the resistor contact regions 23' may extend further into the N type epitaxial layer 12' than the resistor contact regions 23 of the device of FIG. 13, in order to enable the collector contact region 52' of the device of FIG. 19, formed with the resistor contact regions 23', to extend as far as conveniently may be arranged into the epitaxial layer 12'. However, such an extension of the resistor contact regions 23' into the epitaxial layer 12' may not be required.

What I claim is:

1. A method of fabricating a semiconductor device in a semiconductor body, the semiconductor body comprising a substrate of one conductivity type, and an epitaxial layer of said one conductivity type thereon, with an interface therebetween, and the epitaxial layer having a surface remote from the substrate, the device including a bipolar transistor having a collector of the opposite conductivity type the collector comprising a buried, heavily doped, layer at a part of the interface between the substrate and the epitaxial layer, and an isolation barrier, extending through the epitaxial layer to contact the buried, heavily doped, layer, the isolation barrier and the buried layer, together, isolating the bipolar transistor within the semiconductor body, and the isolation barrier also comprising the collector contact region, having a heavily doped surface portion therefor, the bipolar transistor also having a base, and a heavily doped emitter, the base comprising an unmodified portion of the epitaxial layer, a heavily doped region surrounding within the semiconductor body, and being contiguous with, the emitter, and a heavily doped base contact region spaced from the collector contact region, the method including a part wherein there are formed, by modifying selected portions of the semiconductor body, the emitter, the heavily doped base region surrounding the emitter, and the heavily doped base and collector contact regions, said method part including providing on the surface of the epitaxial layer remote from the substrate an initial, and a subsequent, initially continuous, layer of a first resist material, and an initially continuous layer of a second resist material, each provided layer of resist material being capable of acting as a barrier for conductivity type determining impurity, the second resist material being capable of being attacked by an etchant relatively inactive with the first resist material, and the first resist material comprising passivating material for the completed device, said method part also including a sequence of only three photolithographic process steps, in said method part there being provided the initial, initially continuous, layer of first resist material on the epitaxial layer, in the first photolithographic process step of the sequence forming an aperture therein to expose selectively at least part of the body portion to become the collector contact region, introducing a conductivity type determining impurity characteristic of said opposite conductivity type into the semiconductor body through the sole aperture in the initial layer of first resist material, then there being provided the subsequent, initially continuous, layer of first resist material on the epitaxial layer, in the second photolithographic process step of the sequence, forming three apertures in the subsequent layer of first resist material, to expose selectively at least part of each of the body portions to become the emitter and the two contact regions, introducing a conductivity type determining impurity characteristic of said one conductivity type into the semiconductor body through the three apertures in the subsequent layer of first resist material, providing the sole initially continuous layer of second resist material on the so apertured, subsequent, layer of first resist material, in the coarse, third photolithographic process step of the sequence, parts of the layer of second resist material are removed selectively, to expose, selectively, at least part of the body portions to become the emitter and the collector contact region, and introducing a conductivity type determining impurity characteristic of said opposite conductivity type into the semiconductor body through the exposed two apertures in the subsequent layer of first resist material.

2. A method of fabricating a semiconductor device in a semiconductor body, the semiconductor body comprising a substrate of one conductivity type, and an epitaxial layer of said one conductivity type thereon, with an interface therebetween, and the epitaxial layer having a surface remote from the substrate, the device including a bipolar transistor having a collector of the opposite conductivity type, the collector comprising a buried, heavily doped, layer at a part of the interface between the substrate and the epitaxial layer, together with a heavily doped collector contact region extending through the epitaxial layer to contact the buried, heavily doped, layer, the bipolar transistor also having a base, and a heavily doped emitter, the base comprising an unmodified portion of the epitaxial layer, a heavily doped region surrounding within the semiconductor body, and being contiguous with, the emitter, and a heavily doped base contact region spaced from the heavily doped collector contact region, there also being provided an isolation barrier of dielectric material extending through the epitaxial layer, the isolation barrier together with the heavily doped buried layer of the collector isolating the bipolar transistor within the semiconductor body, the method including a part wherein there are formed, by modifying selected portions of the semiconductor body, the emitter, the heavily doped base region surrounding the emitter, and the heavily doped base and collector contact regions, said method part including providing on the surface of the epitaxial layer remote from the substrate an initially continuous layer of a first resist material, and an initial, and a further, initially continuous, layer of a second resist material, each provided layer of resist material being capable of acting as a barrier for conductivity type determining impurity, the second resist material being capable of being attacked by an etchant relatively inactive with the first resist material, and the first resist material comprising passivating material for the completed device, said method part also including a sequence of only three photolithographic process steps, in said method part there being provided the initially continuous layer of first resist material on the epitaxial layer, in the first photolithographic process step of the sequence forming three apertures in the layer of first resist material on the epitaxial layer, to expose selectively at least part of each of the body portions to become the emitter and the two contact regions, then there is provided the initial, initially continuous, layer of second resist material on the so apertured layer of first resist material, in the coarse, second photolithographic process step of the sequence, in which parts of the initial layer of second resist material are removed, to expose selectively an initial pair of the three apertures in the layer of first resist material, there being exposed at least part of the body portion to become the emitter, and at least part of the body portion to become the base contact region, and there is introduced a conductivity type determining impurity characteristic of said one conductivity type into the semiconductor body through the exposed initial pair of apertures in the layer of first resist material, then the initial layer of second resist material is removed, and there is provided the further, initially continuous, layer of second resist material on apertured layer of first resist material, in the coarse, third photolitohgraphic process step of the sequence, in which parts of the further layer of second resist material are removed, to expose selectively a further pair of the three apertures in the layer of first resist material, there being exposed at least part of the body portion to become the emitter, and at least part of the body portion to become the collector contact region, and there is introduced a conductivity type determining impurity characteristic of said opposite conductivity type into the semiconductor body through the exposed further pair of apertures in the layer of first resist material.

3. A method of fabricating a semiconductor device in a semiconductor body, the semiconductor body comprising a substrate of one conductivity type, and an epitaxial layer of said opposite conductivity type thereon, with an interface therebetween, and the epitaxial layer having a surface remote from the substrate, the device including a bipolar transistor isolated within the semiconductor body by an isolation barrier of dielectric material extending through the epitaxial layer, the bipolar transistor having a collector of the opposite conductivity type, the collector comprising a buried, heavily doped, layer at a part of the interface between the substrate and the epitaxial layer, an unmodified portion of the epitaxial layer, and a heavily doped collector contact region, the bipolar transistor also having a base, and a heavily doped emitter, the base comprising both a heavily doped region surrounding within the semiconductor body, and being contiguous with, the emitter, and, contiguous therewith, a heavily doped base contact region spaced from the heavily doped contact region, the method including a part wherein there are formed, by modifying selected portions of the semiconductor body, the emitter, the heavily doped base region surrounding the emitter, and the heavily doped base and collector contact regions, said method part including providing on the surface of the epitaxial layer remote from the substrate an initially continuous layer of a first resist material, and an initial, and a further, initially continuous, layer of a second resist material, each provided layer of resist material being capable of acting as a barrier for conductivity type determining impurity, the second resist material being capable of being attacked by an etchant relatively inactive with the first resist material, and the first resist material comprising passivating material for the completed device, said method part also including a sequence of only three photolithographic process steps, in said method part there being provided the initially continuous layer of first resist material on the epitaxial layer, in the first photolithographic process steps of the sequence forming three apertures in the layer of first resist material on the epitaxial layer, to expose selectively at least part of each of the body portions to become the emitter and the two contact regions, then there is provided the initial, initially continuous, layer of second resist material on the so apertured layer of first resist material, in the coarse, second photolithographic process step of the sequence, in which parts of the initial layer of second resist material are removed, to expose selectively an initial pair of the three apertures in the layer of first resist material, there being exposed at least part of the body portion to become the emitter, and at least part of the body portion to become the base contact region, and there is introduced a conductivity type determining impurity characteristic of said one conductivity type into the semiconductor body through the exposed initial pair of apertures in the layer of first resist material, then the initial layer of second resist material is removed, and there is provided the further, initially continuous, layer of second resist material on the apertured layer of first resist material, in the coarse, third photolithographic process step of the sequence, in which parts of the further layer of second resist material are removed, to expose selectively a further pair of the three apertures in the layer of first resist material, there being exposed at least part of the body portion to become the emitter, and at least part of the body portion to become the collector contact region, and there is introduced a conductivity type determining impurity characteristic of said opposite conductivity type into the semiconductor body through the exposed further pair of apertures in the layer of first resist material.

4. A method as claimed in in any of claims 1, 2 or 3 in which there is provided a semiconductor body of Silicon, the first resist material is Silicon Oxide, and the second resist material is Silicon Nitride.

5. A method as claimed in any of claims 1, 2 or 3 in which the semiconductor includes at least one other type of circuit element formed simultaneously with, and by the same constituent process steps as, the bipolar transistor.

* * * * *